(12) United States Patent
Manning (10) Patent No.: US 6,180,494 B1
(45) Date of Patent: *Jan. 30, 2001

(54) INTEGRATED CIRCUITRY, METHODS OF FABRICATING INTEGRATED CIRCUITRY, METHODS OF FORMING LOCAL INTERCONNECTS, AND METHODS OF FORMING CONDUCTIVE LINES

(75) Inventor: H. Montgomery Manning, Eagle, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/266,456

(22) Filed: Mar. 11, 1999

(51) Int. Cl.$^7$ ............................................ H01L 21/76
(52) U.S. Cl. ............................ 438/443; 438/595; 438/586
(58) Field of Search ........................ 438/443, 424, 438/586, 595

(56) References Cited

U.S. PATENT DOCUMENTS

| | | | |
|---|---|---|---|
| 4,546,538 | 10/1985 | Kawabe et al. | 29/376 |
| 5,081,060 | 1/1992 | Kim | 437/52 |
| 5,126,279 | 6/1992 | Roberts | 437/52 |
| 5,135,882 | 8/1992 | Karniewicz | 437/52 |
| 5,346,585 * | 9/1994 | Doan et al. | 438/690 |
| 5,356,834 * | 10/1994 | Sugimoto et al. | 438/624 |
| 5,413,961 | 5/1995 | Kim | 437/195 |
| 5,494,841 | 2/1996 | Dennison et al. | 437/52 |
| 5,656,520 | 8/1997 | Watanabe | 438/305 |
| 5,717,242 | 2/1998 | Michael et al. | 257/386 |
| 5,733,809 | 3/1998 | Dennison et al. | 438/253 |
| 5,734,179 | 3/1998 | Chang et al. | 257/67 |
| 5,741,735 | 4/1998 | Violette et al. | 438/279 |
| 5,883,010 * | 3/1999 | Merrill et al. | 438/473 |
| 5,898,006 * | 4/1999 | Kudoh | 438/275 |
| 5,899,721 | 5/1999 | Gardner et al. | 438/303 |
| 6,033,969 * | 3/2000 | Yoo et al. | 438/424 |
| 6,051,462 | 4/2000 | Ohno | 438/241 |

FOREIGN PATENT DOCUMENTS

| | | |
|---|---|---|
| 3-161937 | 11/1991 | (JP) . |
| 11-054724 | 2/1999 | (JP) . |

* cited by examiner

Primary Examiner—Charles Bowers
Assistant Examiner—David S Blum
(74) Attorney, Agent, or Firm—Wells, St. John, Roberts, Gregory & Matkin P.S.

(57) ABSTRACT

A method of fabricating integrated circuitry comprises forming a conductive line having opposing sidewalls over a semiconductor substrate. An insulating layer is then deposited. The insulating layer is etched proximate the line along at least a portion of at least one sidewall of the line. An insulating spacer forming layer is then deposited over the substrate and the line. It is anisotropically etched to form an insulating sidewall spacer. A method of forming a local interconnect comprises forming at least two transistor gates over a semiconductor substrate. A local interconnect layer is deposited to overlie at least one of the transistor gates and interconnect at least one source/drain region of one of the gates with semiconductor substrate material proximate another of the transistor gates. In one aspect, a conductivity enhancing impurity is implanted into the local interconnect layer in at least two implanting steps, with one of the implantings providing a peak implant location which is deeper into the layer than the other. Conductivity enhancing impurity is diffused from the local interconnect layer into semiconductor substrate material therebeneath. In one aspect, conductivity enhancing impurity is implanted through the local interconnect layer into semiconductor substrate material therebeneath. Field isolation material regions and active area regions are formed on a semiconductor substrate. A trench is etched into the field isolation material into a desired line configuration. A conductive material is deposited to at least partially fill the trench and form a conductive line therein. Integrated circuitry is disclosed and claimed.

60 Claims, 6 Drawing Sheets

INTEGRATED CIRCUITRY, METHODS OF FABRICATING INTEGRATED CIRCUITRY, METHODS OF FORMING LOCAL INTERCONNECTS, AND METHODS OF FORMING CONDUCTIVE LINES

TECHNICAL FIELD

This invention relates to integrated circuitry, to methods of fabricating integrated circuitry, to methods of forming local interconnects, and to methods of forming conductive lines.

BACKGROUND OF THE INVENTION

The reduction in memory cell and other circuit size implemented in high density dynamic random access memories (DRAMs) and other circuitry is a continuing goal in semiconductor fabrication. Implementing electric circuits involves connecting isolated devices through specific electric paths. When fabricating silicon and other semiconductive materials into integrated circuits, conductive devices built into semiconductive substrates need to be isolated from one another. Such isolation typically occurs in the form of either trench and refill field isolation regions or LOCOS grown field oxide.

Conductive lines, for example transistor gate lines, are formed over bulk semiconductor substrates. Some lines run globally over large areas of the semiconductor substrate. Others are much shorter and associated with very small portions of the integrated circuitry. This invention was principally motivated in making processing and structure improvements involving local interconnects, although the invention is not so limited.

SUMMARY OF THE INVENTION

The invention includes integrated circuitry, methods of fabricating integrated circuitry, methods of forming local interconnects, and methods of forming conductive lines. In one implementation, a method of fabricating integrated circuitry comprises forming a conductive line having opposing sidewalls over a semiconductor substrate. An insulating layer is deposited over the substrate and the line. The insulating layer is etched proximate the line along at least a portion of at least one sidewall of the line. After the etching, an insulating spacer forming layer is deposited over the substrate and the line, and it is anisotropically etched to form an insulating sidewall spacer along said portion of the at least one sidewall.

In one implementation, a method of forming a local interconnect comprises forming at least two transistor gates over a semiconductor substrate. A local interconnect layer is deposited to overlie at least one of the transistor gates and interconnect at least one source/drain region of one of the gates with semiconductor substrate material proximate another of the transistor gates. In one aspect, a conductivity enhancing impurity is implanted into the local interconnect layer in at least two implanting steps, with one of the two implantings providing a peak implant location which is deeper into the layer than the other. Conductivity enhancing impurity is diffused from the local interconnect layer into semiconductor substrate material therebeneath. In one aspect, a conductivity enhancing impurity is implanted through the local interconnect layer into semiconductor substrate material therebeneath.

In one implementation, field isolation material regions and active area regions are formed on a semiconductor substrate. A trench is etched into the field isolation material into a desired line configuration. A conductive material is deposited to at least partially fill the trench and form a conductive line therein.

In one implementation, integrated circuitry comprises a semiconductor substrate comprising field isolation material regions and active area regions. A conductive line is received within a trench formed within the field isolation material.

Other implementations are disclosed, contemplated and claimed in accordance with the invention.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
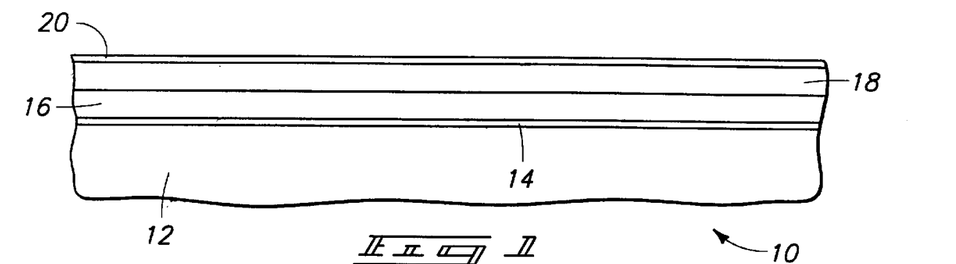
FIG. 1 is a diagrammatic sectional view of a semiconductor wafer fragment at one processing step in accordance with the invention.

Referring to FIG. 1, a semiconductor wafer in process is indicated generally with reference numeral 10. Such comprises a bulk monocrystalline silicon substrate 12. In the context of this document, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductor substrates described above.

A gate dielectric layer 14, such as silicon dioxide, is formed over semiconductor substrate 12. A conductively doped semiconductive layer 16 is formed over gate dielectric layer 14. Conductively doped polysilicon is one example. An insulative capping layer 18 is formed over semiconductive layer 16. An example material is again silicon dioxide. Intervening conductive layers, such as refractory metal suicides, might of course also be interposed between layers 16 and 18. An etch stop layer 20 is formed over insulative capping layer 18. An example referred material is polysilicon.

Figure 2:
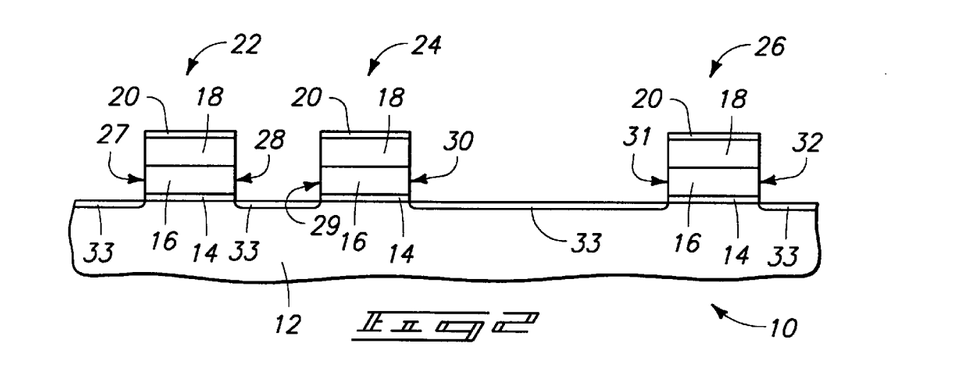
FIG. 2 is a view of the FIG. 1 wafer at a processing step subsequent to that shown by FIG. 1.

Referring to FIG. 2, the above-described layers over substrate 12 are patterned and etched into a plurality of exemplary transistor gate lines 22, 24 and 26. Lines 22, 24 and 26 have respective opposing sidewalls 27 and 28, 29 and 30, and 31 and 32. Lines 22, 24 and 26 are shown in the form of field effect transistor gates, although other conductive lines are contemplated. LDD implant doping is preferably conducted to provide illustrated implant regions 33 for the transistors. One example implant dose for regions 33 would be $2 \times 10^{13}$ ions/cm$^2$. Alternately, the LDD implant doping can implanted after source/drain regions have been formed (or a combination of both). Forming LDD regions later in the process reduces the $D_t$ seen by such implants.

Figure 3:
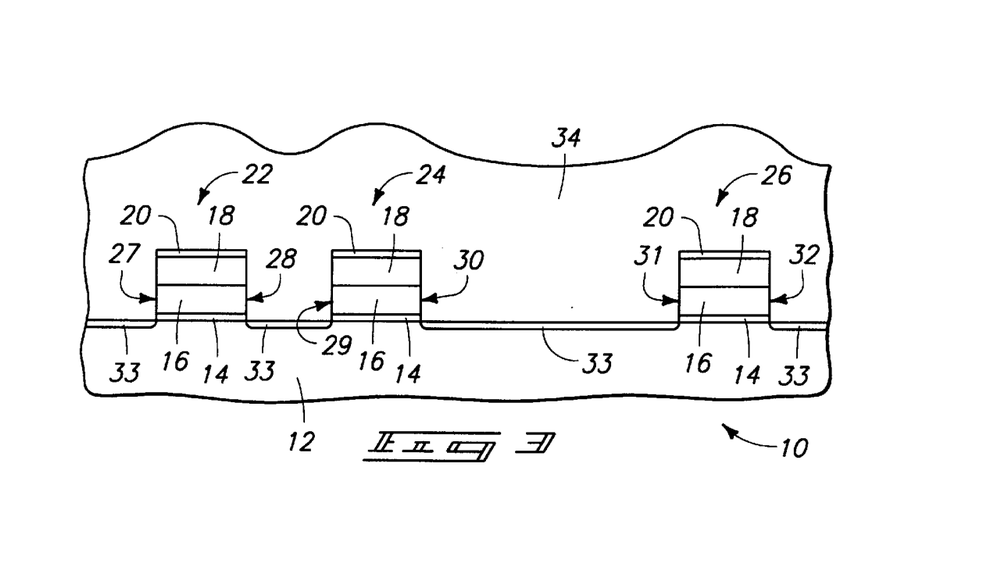
FIG. 3 is a view of the FIG. 1 wafer at a processing step subsequent to that shown by FIG. 2.

Referring to FIG. 3, an insulating layer 34 is deposited over substrate 12 and lines 22, 24 and 26. The thickness of layer 34 is preferably chosen to be greater than that of the combined etch stop layer, capping layer and semiconductor layer, and to be received between the transistor gate lines to fill the illustrated cross-sectional area extending between adjacent gate lines. Example and preferred materials include undoped silicon dioxide deposited by decomposition of tetraethylorthosilicate, and borophosphosilicate glass.

Figure 4:
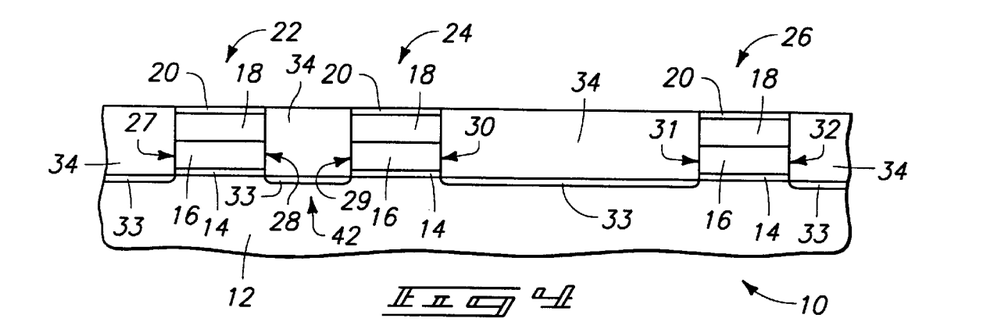
FIG. 4 is a view of the FIG. 1 wafer at a processing step subsequent to that shown by FIG. 3.

Referring to FIG. 4, insulative material layer 34 has been planarized. Such is preferably accomplished by chemical-mechanical polishing using etch stop layer 20 of gates 22, 24 and 26 as an etch stop for such polishing.

Figure 5:
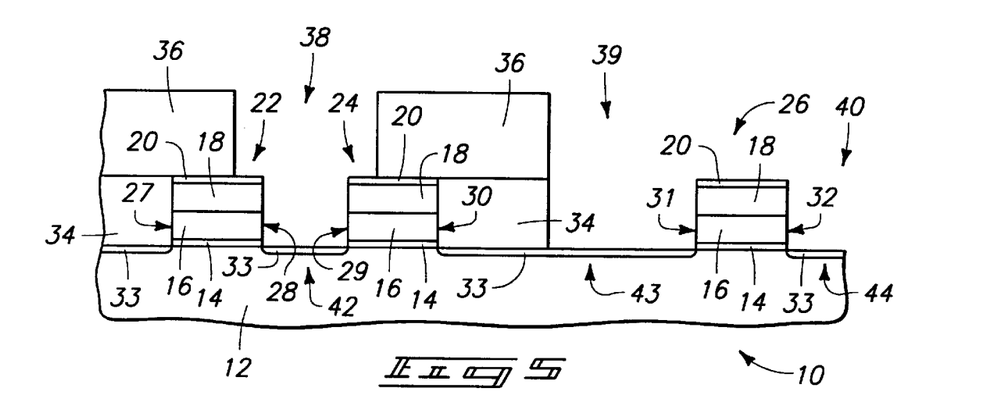
FIG. 5 is a view of the FIG. 1 wafer at a processing step subsequent to that shown by FIG. 4.

Referring to FIG. 5, a layer of photoresist 36 has been deposited and patterned. Insulative material 34 is etched to effectively form contact openings 38, 39 and 40 therein to proximate substrate 12, and preferably effective to outwardly expose material of semiconductor substrate 12. For purposes of the continuing discussion, the exposed portions of semiconductor substrate 12 are designated as locations 42, 43 and 44. The depicted etching constitutes but one example of etching insulating layer 34 proximate lines 22 and 24 along at least a portion of facing sidewalls 28 and 29. Such portion preferably comprises a majority of the depicted sidewalls, and as shown constitutes the entirety of said sidewalls to semiconductor substrate 12.

With respect to line 26, the illustrated insulating layer 34 etching is conducted along at least a portion of each of opposing line sidewalls 31 and 32. Further with respect to lines 22 and 24, such etching of insulating layer 34 is conducted along portions of sidewalls 28 and 29, and not along the respective opposing sidewalls 27 and 30. Further, such insulating layer 34 etching exposes conductive material of at least one of the transistor gates, with such etching in the illustrated example exposing conductive material 16 of sidewalls 28, 29, 31 and 32 of the illustrated transistor gates. Further with respect to gate lines 22 and 24, the insulative material is etched to remain/be received over the one sidewalls 27 and 30, and not sidewalls 28 and 29.

Figure 6:
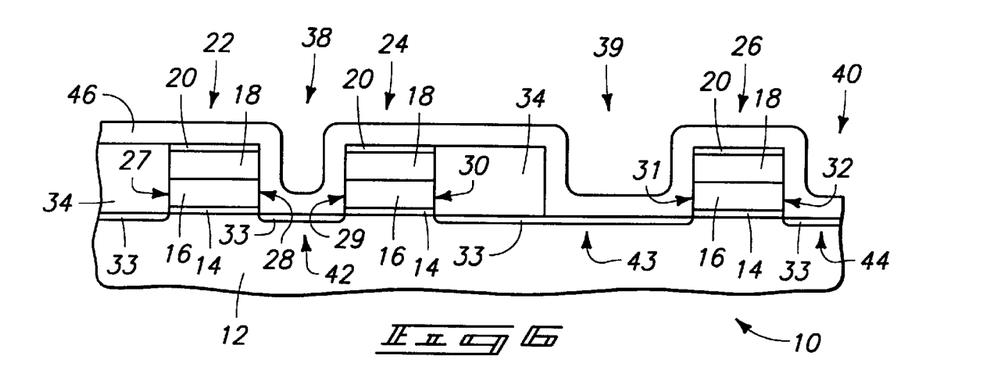
FIG. 6 is a view of the FIG. 1 wafer at a processing step subsequent to that shown by FIG. 5.

After etching of layer 34, at least one of the exposed sidewalls is covered with insulating material. Such preferably comprises deposition of an insulating layer 46 over substrate 12; lines 22, 24 and 26; and planarized and etched insulative material 34 to a thickness which less than completely fills at least some of the contact opening (FIG. 6). Such layer preferably comprises a spacer forming layer, with silicon dioxide and silicon nitride being but two examples.

Figure 7:
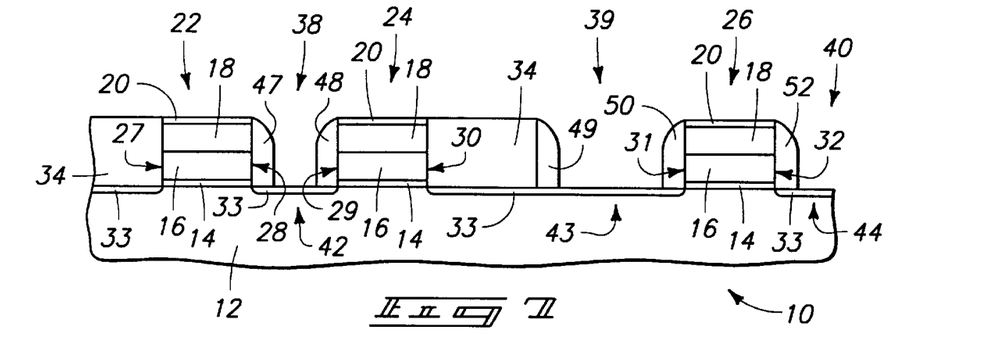
FIG. 7 is a view of the FIG. 1 wafer at a processing step subsequent to that shown by FIG. 6.

Referring to FIG. 7, spacer forming layer 46 is anisotropically etched to form insulative sidewall spacers 47, 48, 49, 50 and 52. Such constitutes but one example of forming the illustrated insulative sidewall spacers. In one implementation, insulating layer 34 is received between at least one of the sidewalls and one of the sidewall spacers, for example as shown with respect to line 24 between sidewall 30 and spacer 49. Further with respect to this example line 24, insulative material 34 is received between the one sidewall 30 and the one insulative spacer 49 formed thereover, and is not received between the opposing sidewall 29 and the other spacer 48 formed thereover. Yet, in the depicted section, insulative sidewall spacers 48 and 49, and 50 and 52 are formed over each of the respective opposing line sidewalls of lines 24 and 26, wherein in the depicted section only one insulative spacer 47 is formed over one sidewall of line 22. Further, insulative material 34 received between sidewall 30 and insulative spacer 49 of line 24 has a maximum lateral thickness which is greater than or equal (greater as shown) to a maximum lateral thickness of sidewall spacer 49. Source/drain implanting may occur at this point in the process, if desired.

Figure 8:
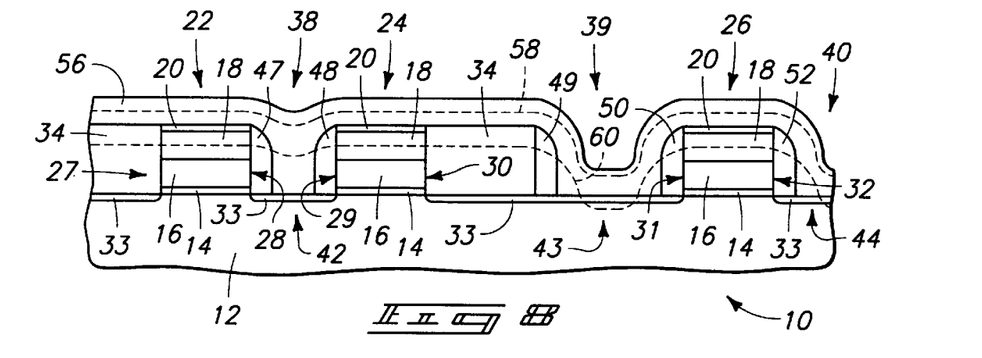
FIG. 8 is a view of the FIG. 1 wafer at a processing step subsequent to that shown by FIG. 7.

Referring to FIG. 8, a local interconnect layer 56 is deposited to overlie at least one of the transistor gates, and ultimately interconnect locations 42, 43 and 44 of substrate 12, and is thus provided in electrical connection therewith. An example preferred material for layer 56 is polysilicon. Due to the spacing constraints between the insulative spacers of lines 22 and 24 versus that of lines 24 and 26, layer 56 completely fills contact opening area 38 and less than completely fills contact opening areas 39 and 40.

Depending on the circuitry being fabricated and the desires of the processor, layer 56 might be in situ conductively doped as deposited and/or separately implanted with conductivity enhancing impurity subsequent to deposition. Further, any such subsequent implantings might be masked to only be provided within portions of layer 56 where, for example, both n-type and p-type substrate regions are being conductively connected by an ultimately conductive interconnect formed from layer 56. Most preferably, interconnect layer 56 will ultimately comprise suitably conductively doped semiconductive material. Where such will comprise both n-type and p-type doping material, another conductive strapping layer, such as a refractory metal silicide, will ideally be formed atop layer 56 to avoid or overcome an inherent parasitic diode that forms where p-type and n-type materials join. Further with respect to combined n-type and p-type processing, multiple local interconnect layers might be provided and patterned, and perhaps utilize intervening insulative layers, spacers or etch stops. Further prior to deposition of layer 56, a conductive dopant diffusion barrier layer might also be provided.

Example preferred implantings, whether p-type, n-type, or a combination of the same, is next described still with reference to FIG. 8. Such depicts two preferred implantings represented by peak implant locations or depths 58 and 60. Such are preferably accomplished by two discrete implantings which provide peak implant location 60 deeper relative to layer 56 than implant 58. For example within layer 56 in contact openings 38 and 39, regions of layer 56 are shown where peak implant 60 is deeper within layer 56 than is peak implant 58. Yet, the peak implant location or depth for implant 60 is preferably not chosen to be so deep to be within conductively doped material 16 of lines 22, 24 and 26. Further in contact opening locations 39 and 40, the implanting to produce depicted implant 60 is conducted through local interconnect layer 56 and into semiconductor substrate material 12 therebeneath. Diffusing of the conductivity enhancing impurity provided within layer 56 might ultimately occur from local interconnect layer 56 into semiconductor substrate material 12 therebeneath within locations 42, 43 and 44 to provide the majority of the conductivity enhancing impurity doping for the source/drain regions of the illustrated transistor lines. Depending on the processor's desire and the degree of diffusion, such source/drain regions might principally reside within semiconductor substrate material 12, or reside as elevated source/drain regions within layer 56.

Further and as shown, layer 56 in certain locations acts as a spacer for the deeper implant. Further, such may actually reduce junction capacitance by counter doping halo implants that are further away from gate polysilicon. This can provide flexibility in the settings of the halo implants.

Figure 9:
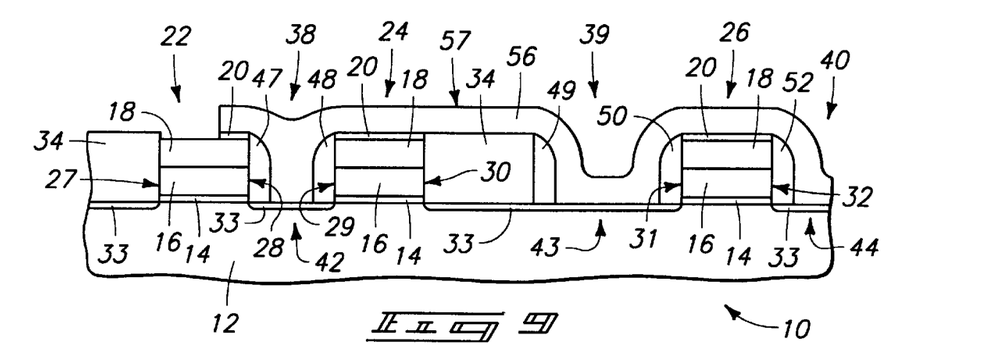
FIG. 9 is a view of the FIG. 1 wafer at a processing step subsequent to that shown by FIG. 8.

Referring to FIG. 9, local interconnect layer 56 is formed (i.e., by photopatterning and etching) into a local interconnect line 57 which overlies at least portions of illustrated conductive lines 24, 26 and 28, and electrically interconnects substrate material locations 42, 43 and 44.

Figure 10:
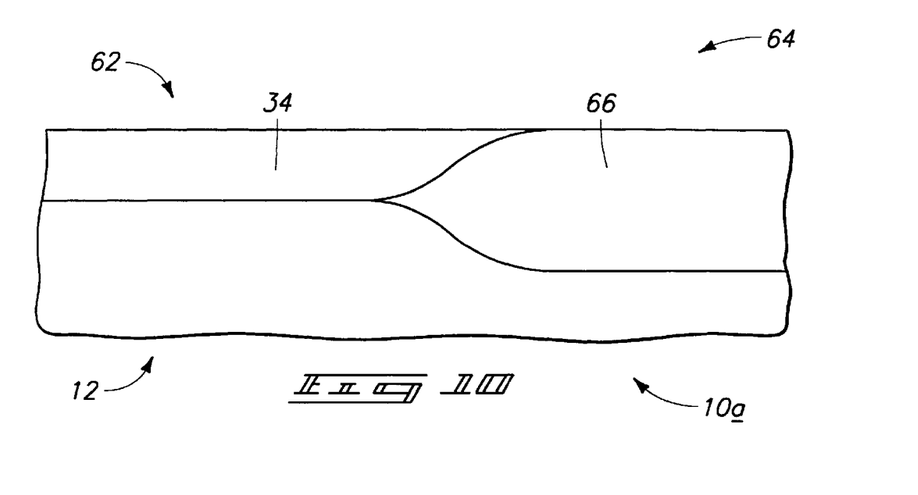
FIG. 10 is a diagrammatic sectional view of an alternate embodiment semiconductor wafer fragment at one processing step in accordance with the invention.
Figure 11:
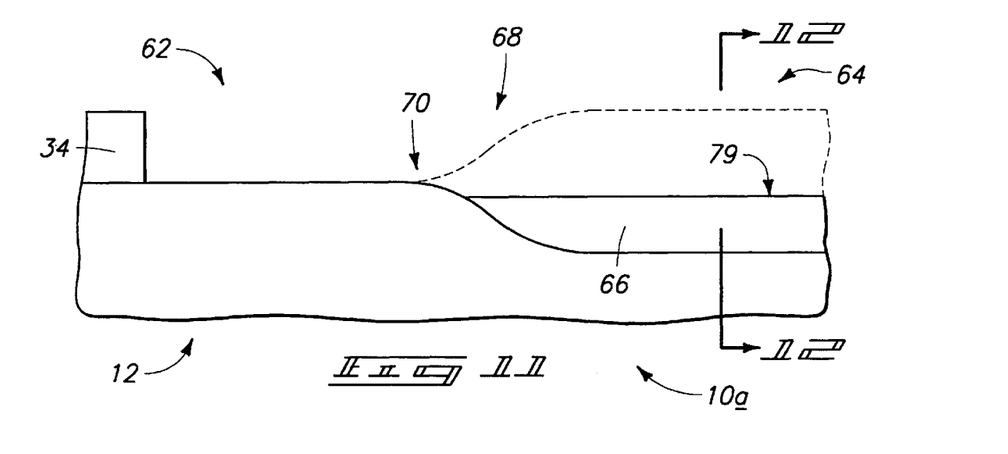
FIG. 11 is a view of the FIG. 10 wafer at a processing step subsequent to that shown by FIG. 10.
Figure 12:
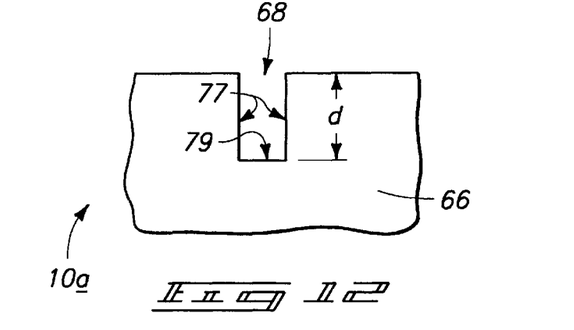
FIG. 12 is a view of FIG. 11 taken through line 12—12 in FIG. 11.

Further considered aspects of the invention are next described with reference to FIGS. 10–16. FIG. 10 illustrates a semiconductor wafer fragment 10a comprising a bulk monocrystalline silicon substrate 12. Semiconductor substrate 12 has been patterned to form field isolation region 64 and active area region 62. In the illustrated example, material 66 of field isolation region 64 comprises silicon dioxide fabricated by LOCOS processing. Such might constitute other material and other isolation techniques, for example trench and refill resulting from etching trenches into substrate 12 and depositing oxide such as by CVD, including PECVD.

Fragment 10a in a preferred and exemplary embodiment comprises an extension of fragment 10 of the first described embodiment, such as an extension in FIG. 10 starting from the far right portion of FIG. 4 of the first described embodiment. Accordingly, insulating layer 34 is shown as having been deposited and planarized, Referring to FIGS. 11 and 12, a trench 68 is etched into field isolation material 66 and is received within insulating layer 34. Such includes opposing insulative sidewalls 77 and a base 79. Trench 68 in this illustrated example extends to an edge 70 of isolation material 66 proximate, and here extending to, active area substrate material 12 of region 62. An example preferred depth for trench opening 68 is 10% to 20% greater than the combined thickness of the conductive and insulating materials of gate stacks 22, 24 and 26.

Figure 13:
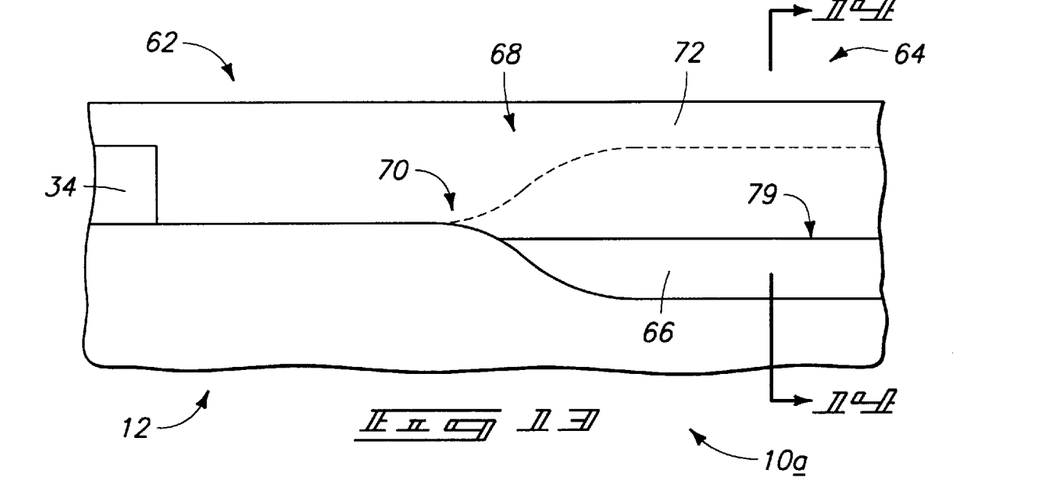
FIG. 13 is a view of the FIG. 10 wafer at a processing step subsequent to that shown by FIG. 11.
Figure 14:
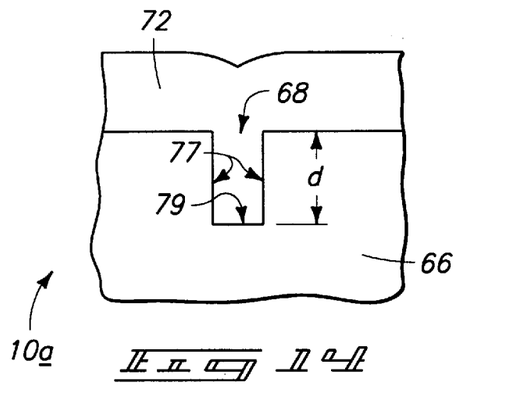
FIG. 14 is a view of FIG. 13 taken through line 14—14 in FIG. 13.

Referring to FIGS. 13 and 14, a conductive material 72 is deposited to at least partially fill trench 68, and electrically connects with substrate material 12 of active area region 62.

As shown, material 72 is preferably deposited to overfill trench 68. The width of trench 68 is preferably chosen to be more narrow than double the thickness of layer of material 72. Such preferred narrow nature of trench 68 facilitates complete filling thereof with conductive material 72 in spite of its depth potentially being greater than the globally deposited thickness of layer 72.

Figure 15:
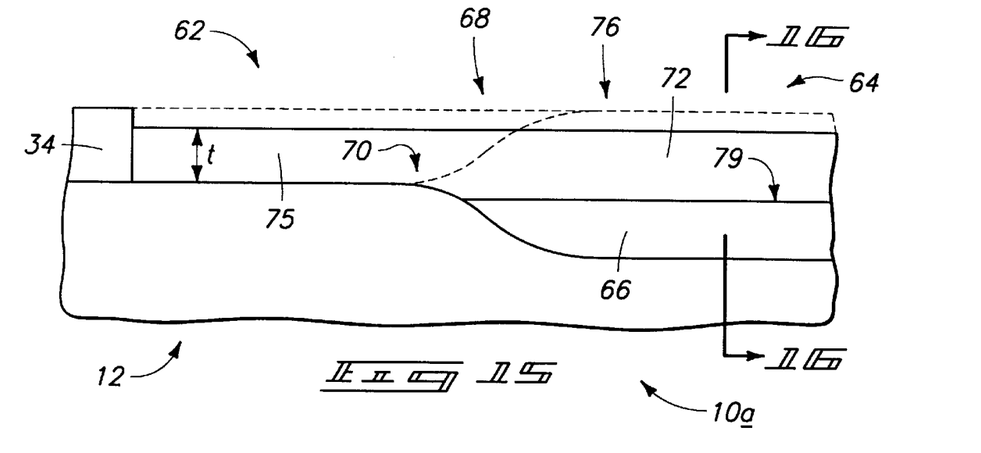
FIG. 15 is a view of the FIG. 10 wafer at a processing step subsequent to that shown by FIG. 13.
Figure 16:
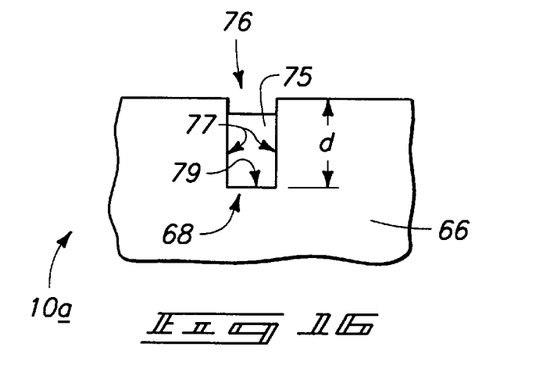
FIG. 16 is a view of FIG. 15 taken through line 16—16 in FIG. 15.

Referring to FIGS. 15 and 16, conductive layer 72 has been etched to produce the illustrated local interconnect line 75 which includes a line segment 76 received within trench 68 over isolation material 66. A small degree of overetch preferably occurs as shown to assure complete removal material 72 from over the outer surface of insulating layer 34. Ideally, the shape of trench 68 is chosen and utilized to define the entire outline and shape of the conductive line being formed relative to isolation material 66. Further, conductive material of line 75 preferably contacts material 66 of trench sidewalls 77 and base 79.

Figure 17:
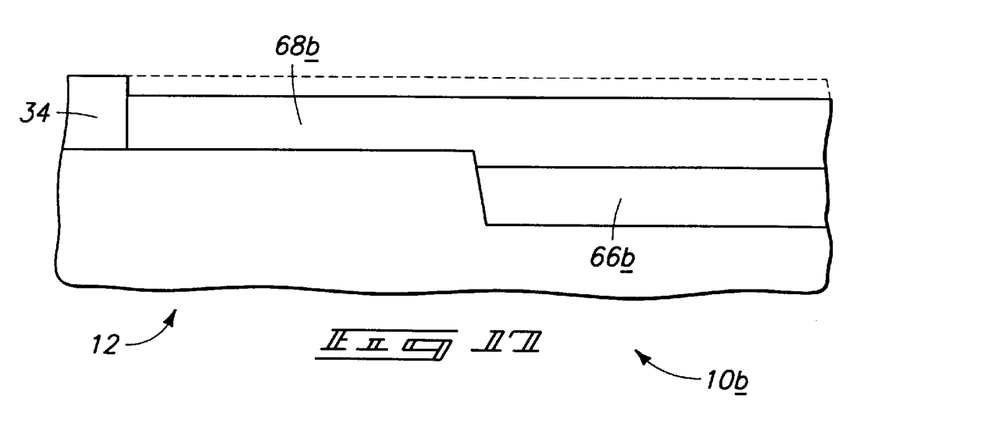
FIG. 17 is a diagrammatic sectional view of another alternate embodiment semiconductor wafer fragment at one processing step in accordance with the invention, and corresponds in sequence to that of FIG. 16.

FIG. 17 illustrates an exemplary alternate wafer fragment 10b embodiment corresponding to FIG. 16, but using a trench isolation oxide 66b as opposed to LOCOS oxide 66. An exemplary preferred trench filled line 68b is shown.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fabricating integrated circuitry comprising:

forming a conductive line having opposing sidewalls over a semiconductor substrate;

depositing an insulating layer over the substrate and the line;

etching the insulating layer proximate the line along at least a portion of at least one sidewall of the line;

after the etching, depositing an insulating spacer forming layer over the substrate and the line, and anisotropically etching it to form an insulating sidewall spacer along said portion of the at least one sidewall;

forming field isolation material regions and active area regions on the semiconductor substrate before the depositing;

etching a trench into the field isolation material and the insulating layer into a desired local interconnect line configuration; and forming a local interconnect layer of material over the substrate which at least partially fills the trench and which electrically connects with one of the active area regions.

2. The method of claim 1 wherein the forming of the local interconnect layer of material overfills the trench with such interconnect layer material.

3. The method of claim 1 wherein the local interconnect layer of material is initially formed by depositing to overfill the trench, and comprising removing some of the local interconnect layer of material after the initial deposition to leave the trench only partially filled with such interconnect layer material.

4. The method of claim 1 wherein the trench etching comprises forming the trench to have opposing sidewalls having some opposing portions thereof which are substantially parallel with one another.

5. The method of claim 4 wherein the opposing sidewalls extend to a trench base extending between the sidewalls, the trench base including a portion which is substantially perpendicular to the sidewall opposing portions.

6. The method of claim 4 wherein the sidewall opposing portions extend to a trench base extending between the sidewalls.

7. The method of claim 1 wherein the trench etching comprises forming the trench to have opposing sidewalls which extend from an outer surface of the field isolation material substantially parallel with one another to a trench base.

8. A method of fabricating integrated circuitry comprising:
   forming a pair of transistor gates having respective opposing sidewalls over a semiconductor substrate, one sidewall of one of the transistor gates facing one sidewall of the other transistor gate;
   depositing an insulating layer over the substrate and between the pair of transistor gates to fill an area extending therebetween;
   etching a contact opening into the insulating layer to proximate the substrate between the pair of transistor gates;
   depositing an insulating spacer forming layer within the contact opening to less than completely fill the contact opening;
   anisotropically etching the spacer forming layer to form a pair of insulating sidewall spacers over the one sidewalls of the pair of transistor gates;
   forming field isolation material regions and active area regions on the semiconductor substrate before the depositing;
   etching a trench into the field isolation material and the insulating layer into a desired local interconnect line configuration; and
   forming a local interconnect layer of material over the substrate which at least partially fills the trench and which electrically connects with one of the active area regions.

9. The method of claim 8 wherein the forming of the local interconnect layer of material overfills the trench with such interconnect layer material.

10. The method of claim 8 wherein the local interconnect layer of material is initially formed by depositing to overfill the trench, and comprising removing some of the local interconnect layer of material after the initial deposition to leave the trench only partially filled with such interconnect layer material.

11. The method of claim 8 wherein the trench etching comprises forming the trench to have opposite sidewalls having some opposing portions thereof which are substantially parallel with one another.

12. The method of claim 11 wherein the opposing sidewalls extend to a trench base extending between the sidewalls, the trench base including a portion which is substantially perpendicular to the sidewall opposing portions.

13. The method of claim 11 wherein the sidewall opposing portions extend to a trench base extending between the sidewalls.

14. The method of claim 8 wherein the trench etching comprises forming the trench to have opposing sidewalls which extend from an outer surface of the field isolation material substantially parallel with one another to a trench base.

15. A method of fabricating integrated circuitry comprising:
   forming a pair of transistor gates having respective opposing sidewalls over a semiconductor substrate, one sidewall of one of the transistor gates facing one sidewall of the other transistor gate;
   depositing an insulating layer over the substrate and between the pair of transistor gates to fill an area extending therebetween;
   etching a contact opening into the insulating layer to proximate the substrate between the pair of transistor gates, the etching exposing conductive material of at least one of the one sidewalls of the pair of transistor gates;
   after the etching, covering the at least one of the one sidewalls with insulating material;
   forming electrically conductive material within the opening in electrical connection with material of the semiconductor substrate;
   forming field isolation material regions and active area regions on the semiconductor substrate before the depositing;
   etching a trench into the field isolation material and the insulating layer into a desired local interconnect line configuration; and
   forming a local interconnect layer of material over the substrate which at least partially fills the trench and which electrically connects with one of the active area regions.

16. The method of claim 15 wherein the forming of the local interconnect layer of material overfills the trench with such interconnect layer material.

17. The method of claim 15 wherein the local interconnect layer of material is initially formed by depositing to overfill the trench, and comprising removing some of the local interconnect layer of material after the initial deposition to leave the trench only partially filled with such interconnect layer material.

18. The method of claim 15 wherein the trench etching comprises forming the trench to have opposing sidewalls having some opposing portions thereof which are substantially parallel with one another.

19. The method of claim 18 wherein the opposing sidewalls extend to a trench base extending between the sidewalls, the trench base including a portion which is substantially perpendicular to the sidewall opposing portions.

20. The method of claim 18 wherein the sidewall opposing portions extend to a trench base extending between the sidewalls.

21. The method of claim 15 wherein the trench etching comprises forming the trench to have opposing sidewalls which extend from an outer surface of the field isolation material substantially parallel with one another to a trench base.

22. A method of forming a local interconnect comprising:
   forming a pair of transistor gates having respective opposing sidewalls over a semiconductor substrate;
   depositing an insulating layer over the substrate and between the pair of transistor gates;
   etching a first contact opening into the insulating layer to proximate the substrate between the pair of transistor gates and another contact opening through the insulating layer to proximate the substrate proximate an opposing side of one of the pair of transistor gates;

forming insulating sidewall spacers over the opposing sidewalls of the one transistor gate, the insulating layer being received between at least one of said sidewalls and one of said sidewall spacers;

forming a local interconnect layer to overlie the one transistor gate and electrically connect with semiconductor substrate material between the pair of transistor gates and semiconductor substrate material proximate the opposing side of the one transistor gate;

forming field isolation material regions and active area regions on the semiconductor substrate before the depositing;

etching a trench into the field isolation material and the insulating layer into a desired local interconnect line configuration; and forming the local interconnect layer to at least partially fill the trench and which electrically connects with one of the active area regions.

23. The method of claim 22 wherein the forming of the local interconnect layer of material overfills the trench with such interconnect layer material.

24. The method of claim 22 wherein the local interconnect layer of material is initially formed by depositing to overfill the trench, and comprising removing some of the local interconnect layer of material after the initial deposition to leave the trench only partially filled with such interconnect layer material.

25. The method of claim 22 wherein the trench etching comprises forming the trench to have opposing sidewalls having some opposing portions thereof which are substantially parallel with one another.

26. The method of claim 25 wherein the opposing sidewalls extend to a trench base extending between the sidewalls, the trench base including a portion which is substantially perpendicular to the sidewall opposing portions.

27. The method of claim 25 wherein the sidewall opposing portions extend to a trench base extending between the sidewalls.

28. The method of claim 22 wherein the trench etching comprises forming the trench to have opposing sidewalls which extend from an outer surface of the field isolation material substantially parallel with one another to a trench base.

29. A method of forming a conductive line comprising:
forming field isolation material regions and active area regions on a semiconductor substrate;
etching a trench into the field isolation material into a desired line configuration; and
depositing a conductive material to at least partially fill the trench and form a conductive line therein.

30. The method of claim 29 comprising forming the field isolation material to comprise LOCOS oxide.

31. The method of claim 29 comprising depositing an insulative layer over the active area and field isolation regions, and planarizing the insulative layer prior to the etching.

32. The method of claim 29 comprising depositing an insulative layer over the active area and field isolation regions, and planarizing the insulative layer prior to the etching; the etching comprising etching the trench to be received within the planarized insulative layer.

33. The method of claim 29 comprising forming the field isolation material to comprise CVD oxide formed within etched substrate trenches.

34. The method of claim 29 wherein the conductive material is initially deposited to overfill the trench, and comprising removing some of the conductive material after the initial deposition to leave the trench only partially filled with the conductive material.

35. The method of claim 29 wherein the conductive material is deposited to overfill the trench.

36. The method of claim 29 wherein the trench etching comprises forming the trench to have opposing sidewalls having some opposing portions thereof which are substantially parallel with one another.

37. The method of claim 36 wherein the opposing sidewalls extend to a trench base extending between the sidewalls, the trench base including a portion which is substantially perpendicular to the sidewall opposing portions.

38. The method of claim 36 wherein the sidewall opposing portions extend to a trench base extending between the sidewalls.

39. The method of claim 29 wherein the trench etching comprises forming the trench to have opposing sidewalls which extend from an outer surface of the field isolation material substantially parallel with one another to a trench base.

40. A method of forming a local interconnect comprising:
etching a trench into field isolation material formed relative to a semiconductor substrate, the trench in the field isolation material extending to an edge of the isolation material proximate active area substrate material; and
forming a local interconnect layer of material over the substrate which at least partially fills the trench and which electrically connects with said active area substrate material.

41. The method of claim 40 comprising forming the field isolation material to comprise LOCOS oxide.

42. The method of claim 40 comprising forming the field isolation material to comprise CVD oxide formed within etched substrate trenches.

43. The method of claim 40 wherein the local interconnect layer is initially deposited to overfill the trench, and comprising removing some of the interconnect layer after the initial deposition to leave the trench only partially filled with the interconnect layer.

44. The method of claim 40 wherein the conductive material is deposited to overfill the trench.

45. The method of claim 40 wherein the trench etching comprises forming the trench to have opposing sidewalls having some opposing portions thereof which are substantially parallel with one another.

46. The method of claim 45 wherein the opposing sidewalls extend to at trench base extending between the sidewalls, the trench base including a portion which is substantially perpendicular to the sidewall opposing portions.

47. The method of claim 45 wherein the sidewall opposing portions extend to a trench base extending between the sidewalls.

48. The method of claim 40 wherein the trench etching comprises forming the trench to have opposing sidewalls which extend from an outer surface of the field isolation material substantially parallel with one another to a trench base.

49. A method of fabricating integrated circuitry comprising:
forming a conductive line having opposing sidewalls over a semiconductor substrate;
depositing an insulating layer over the substrate and the line;

etching the insulating layer proximate the line along at least a portion of at least one sidewall of the line;

after the etching, depositing an insulating spacer forming layer over the substrate and the line, and anisotropically etching it to form an insulating sidewall spacer along said portion of the at least one sidewall;

forming field isolation material regions and active area regions on the semiconductor substrate before the depositing;

etching a trench into the field isolation material and the insulating layer into a desired local interconnect line configuration; and forming a local interconnect layer of material over the substrate which at least partially fills the trench.

50. The method of claim 49 wherein the forming of the local interconnect layer of material overfills the trench with such interconnect layer material.

51. The method of claim 49 wherein the local interconnect layer of material is initially formed by depositing to overfill the trench, and comprising removing some of the local interconnect layer of material after the initial deposition to leave the trench only partially filled with such interconnect layer material.

52. A method of fabricating integrated circuitry comprising:

forming a pair of transistor gates having respective opposing sidewalls over a semiconductor substrate, one sidewall of one of the transistor gates facing one sidewall of the other transistor gate;

depositing an insulating layer over the substrate and between the pair of transistor gates to fill an area extending therebetween;

etching a contact opening into the insulating layer to proximate the substrate between the pair of transistor gates;

depositing an insulating spacer forming layer within the contact opening to less than completely fill the contact opening;

anisotropically etching the spacer forming layer to form a pair of insulting sidewall spacers over the one sidewalls of the pair of transistor gates;

forming field isolation material regions and active area regions on the semiconductor substrate before the depositing;

etching a trench into a field isolation material and the insulating layer into a desired local interconnect line configuration; and forming a local interconnect layer of material over the substrate which at least partially fills the trench.

53. The method of claim 52 wherein the forming of the local interconnect layer of material overfills the trench with such interconnect layer material.

54. The method of claim 52 wherein the local interconnect layer of material is initially formed by depositing to overfill the trench, and comprising removing some of the local interconnect layer of material after the initial deposition to leave the trench only partially filled with such interconnect layer material.

55. A method of fabricating integrated circuitry comprising:

forming a pair of transistor gates having respective opposing sidewalls over a semiconductor substrate, one sidewall of one of the transistor gates facing one sidewall of the other transistor gate;

depositing an insulating layer over the substrate and between the pair of transistor gates to fill an area extending therebetween;

etching a contact opening into the insulating layer to proximate the substrate between the pair of transistor gates, the etching exposing conductive material of at least one of the one sidewalls of the pair of transistor gates;

after the etching, covering the at least one of the one sidewalls with insulating material;

forming electrically conductive material within the opening in electrical connection with material of the semiconductor substrate;

forming field isolation material regions and active area regions on the semiconductor substrate before the depositing;

etching a trench into the field isolation material and the insulating layer into a desired local interconnect line configuration; and forming a local interconnect layer of material over the substrate which at least partially fills the trench.

56. The method of claim 55 wherein the forming of the local interconnect layer of material overfills the trench with such interconnect layer material.

57. The method of claim 55 wherein the local interconnect layer of material is initially formed by depositing to overfill the trench, and comprising removing some of the local interconnect layer of material after the initial deposition to leave the trench only partially filled with such interconnect layer material.

58. A method of forming a local interconnect comprising:

forming a pair of transistor gates having respective opposing sidewalls over a semiconductor substrate;

depositing an insulating layer over the substrate and between the pair of transistor gates;

etching a first contact opening into the insulating layer to proximate the substrate between the pair of transistor gates and another contact opening through the insulating layer to proximate the substrate proximate an opposing side of one of the pair of transistor gates;

forming insulating sidewall spacers over the opposing sidewalls of the one transistor gate, the insulating layer being received between at least one of said sidewalls and one of said sidewall spacers;

forming a local interconnect layer to overlie the one transistor gate and electrically connect with semiconductor substrate material between the pair of transistor gates and semiconductor substrate material proximate the opposing side of the one transistor gate;

forming field isolation material regions and active area regions on the semiconductor substrate before the depositing;

etching a trench into the field isolation material and the insulating layer into a desired local interconnect line configuration; and forming the local interconnect layer to at least partially fill the trench.

59. The method of claim 58 wherein the forming of the local interconnect layer of material overfills the trench with such interconnect layer material.

60. The method of claim 58 wherein the local interconnect layer of material is initially formed by depositing to overfill the trench, and comprising removing some of the local interconnect layer of material after the initial deposition to leave the trench only partially filled with such interconnect layer material.

* * * * *

UNITED STATES PATENT AND TRADEMARK OFFICE
CERTIFICATE OF CORRECTION

PATENT NO.     : 6,180,494 B1
DATED          : January 30, 2001
INVENTOR(S)    : H. Montgomery Manning It is certified that error appears in the above-identified patent and that said Letters Patent is hereby corrected as shown below:

Column 3,
Line 18, please delete "suicides" and insert -- "silicides" after "metal".
Line 20, please delete "referred" and insert -- "preferred" -- after "example".

Signed and Sealed this

Twenty-seventh Day of November, 2001

Attest:

Nicholas P. Godici

Attesting Officer

NICHOLAS P. GODICI
Acting Director of the United States Patent and Trademark Office